(12) United States Patent
Park

(10) Patent No.: US 10,259,097 B2
(45) Date of Patent: Apr. 16, 2019

(54) WAFER POLISHING APPARATUS AND WAFER POLISHING METHOD USING SAME

(71) Applicant: SK SILTRON CO., LTD., Gumi-si, Gyeongsangbuk-do (KR)

(72) Inventor: Woo Shik Park, Gumi-si (KR)

(73) Assignee: SK SILTRON CO., LTD., Gumi-si, Gyeongsangbuk-Do ( * ) Notice: Subject to any disclaimer, the term of this patent is extended or adjusted under 35 U.S.C. 154(b) by 0 days.

(21) Appl. No.: 15/542,646

(22) PCT Filed: Jun. 17, 2015

(86) PCT No.: PCT/KR2015/006129
§ 371 (c)(1),
(2) Date: Jul. 10, 2017

(87) PCT Pub. No.: WO2016/114458
PCT Pub. Date: Jul. 21, 2016

(65) Prior Publication Data
US 2017/0355060 A1  Dec. 14, 2017

(30) Foreign Application Priority Data

Jan. 16, 2015 (KR) ........................ 10-2015-0007963

(51) Int. Cl.
*B24B 37/013* (2012.01)
*B24B 37/08* (2012.01)
(Continued)

(52) U.S. Cl.
CPC ............ *B24B 37/013* (2013.01); *B24B 37/08* (2013.01); *B24B 37/205* (2013.01);
(Continued)

(58) Field of Classification Search
CPC ..... B24B 37/013; B24B 37/08; B24B 37/205; H01L 21/02024; H01L 21/67253; H01L 22/12; H01L 22/26
(Continued)

(56) References Cited

U.S. PATENT DOCUMENTS 4,272,924 A * 6/1981 Masuko ................. B24B 37/08
                                                        367/96
4,433,510 A * 2/1984 Katagiri ................ G01B 21/08
                                                        318/607
(Continued)

FOREIGN PATENT DOCUMENTS

JP     H07-260455      10/1995
JP     H09-150367       6/1997
(Continued)

OTHER PUBLICATIONS

International Search Report (with English Translation) and Written Opinion dated Oct. 12, 2015 issued in Application No. PCT/KR2015/006129.
(Continued)

*Primary Examiner* — Eileen P Morgan
(74) *Attorney, Agent, or Firm* — Ked & Associates, LLP

(57) ABSTRACT

An embodiment comprises: a lower plate; an upper plate which is disposed on the lower plate and rotates; a carrier which receives a wafer and is disposed on the lower plate; and a sensor unit for irradiating light to the wafer received in the carrier, detecting light reflected by the wafer, and outputting detection data according to the detection result, wherein the sensor unit rotates together with the upper plate.

16 Claims, 14 Drawing Sheets

(51) Int. Cl.
*B24B 37/20* (2012.01)
*H01L 21/02* (2006.01)
*H01L 21/67* (2006.01)
*H01L 21/66* (2006.01)

(52) U.S. Cl.
CPC .. *H01L 21/02024* (2013.01); *H01L 21/67253* (2013.01); *H01L 22/12* (2013.01); *H01L 22/26* (2013.01)

(58) Field of Classification Search
USPC .......................... 451/5, 10, 11, 41, 285, 287
See application file for complete search history.

(56) References Cited

U.S. PATENT DOCUMENTS

| | | | | |
|---|---|---|---|---|
| 5,969,521 A * | 10/1999 | Kurita | ............... | B24B 37/08 271/265.04 |
| 7,137,867 B2 * | 11/2006 | Nagayama | ............ | B24B 37/013 451/5 |
| 7,614,934 B2 * | 11/2009 | Onishi | ................ | B24B 37/013 451/262 |
| 8,834,230 B2 * | 9/2014 | Furukawa | ............ | B24B 37/042 451/36 |
| 9,108,289 B2 * | 8/2015 | Furukawa | ............ | B24B 37/042 |
| 9,289,876 B2 * | 3/2016 | Ogata | .................... | B24B 37/08 |
| 9,403,257 B2 * | 8/2016 | Miura | ..................... | B24B 49/12 |
| 2003/0104698 A1 * | 6/2003 | Taniguchi | ............ | B24B 37/042 438/692 |
| 2005/0124264 A1 * | 6/2005 | Tominaga | .............. | B24B 37/08 451/41 |
| 2006/0194511 A1 * | 8/2006 | Nagayama | ............ | B24B 37/08 451/5 |
| 2008/0227371 A1 * | 9/2008 | Onishi | ................ | B24B 37/013 451/262 |
| 2010/0009155 A1 * | 1/2010 | Hashii | ................ | B24B 37/042 428/220 |
| 2011/0130073 A1 * | 6/2011 | Furukawa | ............. | B24B 37/042 451/6 |
| 2012/0329373 A1 * | 12/2012 | Ueno | .................... | B24B 37/013 451/262 |
| 2014/0162456 A1 * | 6/2014 | Oba | ....................... | B24B 37/005 438/693 |
| 2015/0065010 A1 * | 3/2015 | Miura | .................... | B24B 49/12 451/11 |
| 2015/0165585 A1 * | 6/2015 | Ogata | .................... | B24B 37/08 451/5 |
| 2015/0209931 A1 * | 7/2015 | Asai | ........................ | B24B 37/08 451/6 |
| 2015/0321311 A1 * | 11/2015 | Sasaki | .................... | B24B 37/28 451/41 |
| 2016/0196966 A1 * | 7/2016 | Yamashita | ........ | H01L 21/02052 438/5 |
| 2018/0056478 A1 * | 3/2018 | Kanzow | ................ | B24B 37/013 |
| 2018/0138097 A1 * | 5/2018 | Oba | ....................... | B24B 37/013 |

FOREIGN PATENT DOCUMENTS

| | | |
|---|---|---|
| JP | H10-202514 | 8/1998 |
| JP | 2000-091282 | 3/2000 |
| JP | 2000-216116 | 8/2000 |
| JP | 2002-059364 | 2/2002 |
| JP | 2007-220775 | 8/2007 |
| JP | 2010-030019 | 2/2010 |
| JP | 2010-253627 | 11/2010 |
| KR | 10-2009-0108263 | 10/2009 |

OTHER PUBLICATIONS

Third Party Observation dated May 15, 2017.
Japanese Office Action dated Aug. 29, 2018 issued in Application No. 2017-536284.
Japanese Notice of Allowance dated Jan. 29, 2019 issued in Application No. 2017-536284.

* cited by examiner

WAFER POLISHING APPARATUS AND WAFER POLISHING METHOD USING SAME

CROSS-REFERENCE TO RELATED PATENT APPLICATIONS

This application is a U.S. National Stage Application under 35 U.S.C. 371 of PCT Application No. PCT/KR2015/006129, filed Jun. 17, 2015, which claims priority to Korean Patent Application No. 10-2015-0007963, filed Jan. 16, 2015, whose entire disclosures are hereby incorporated by reference.

TECHNICAL FIELD

Embodiments relate to a wafer polishing apparatus and a wafer polishing method using the same.

BACKGROUND ART

In general, a silicon wafer may be manufactured by growing a silicon single-crystal ingot using the Czochralski method (CZ method), slicing the silicon ingot using a wire saw to obtain a sliced wafer, and performing lapping, etching, cleaning and polishing processes on the sliced wafer.

In the polishing process, both surfaces of the sliced wafer are polished using a double-side polishing apparatus, thereby obtaining a flattened silicon wafer.

The wafer polishing speed may vary for processing tools, such as a polishing cloth and a carrier, and deterioration of a material whenever the polishing process is performed. Therefore, in the case in which the polishing process is performed for a fixed time period, the thickness of the polished wafer may vary due to variation in the polishing speed attributable to the above-mentioned causes. It is necessary to measure the thickness of the wafer that is being polished and to adjust the polishing speed simultaneously therewith.

DISCLOSURE

Technical Problem

Embodiments provide a wafer polishing apparatus, which is capable of accurately measuring the thickness of a wafer that is being polished and of improving the polishing quality of the wafer, and a wafer polishing method.

Technical Solution

In one embodiment, a wafer polishing apparatus includes a lower surface plate, an upper surface plate disposed above the lower surface plate and configured to rotate, a carrier disposed on the lower surface plate to receive a wafer therein, and a sensor unit for radiating light to the wafer received in the carrier, detecting light reflected by the wafer, and outputting detection data based on a detection result, wherein the sensor unit rotates together with the upper surface plate.

The upper surface plate may have a through-hole to allow light radiated from the sensor unit to pass therethrough.

The wafer polishing apparatus may further include a control unit for calculating a thickness of a polished wafer based on the detection data.

The sensor unit may include a thickness-measuring sensor configured to rotate together with the upper surface plate and to output the detection data, a cable for transmitting the detection data to the control unit, and a rotary connector connected to the cable.

The sensor unit may be secured to an upper surface of the upper surface plate.

The wafer polishing apparatus may further include a first load-compensating unit secured to a region of the upper surface of the upper surface plate that is opposite a region of the upper surface of the upper surface plate to which the sensor unit is secured, wherein the first load-compensating unit may have the same weight as the sensor unit.

The wafer polishing apparatus may further include a slurry supply unit disposed on the upper surface plate to supply slurry to the upper surface plate and configured to rotate together with the upper surface plate. The sensor unit may be secured to the slurry supply unit.

The wafer polishing apparatus may further include a second load-compensating unit secured to a region of the slurry supply unit that is opposite a region of the slurry supply unit to which the sensor unit is secured, wherein the second load-compensating unit may have the same weight as the sensor unit.

The upper surface plate may have a recess formed in the upper surface thereof to allow one end of the sensor unit to be inserted thereinto, and the through-hole may be formed through a bottom of the recess and the upper surface plate.

The wafer polishing apparatus may further include a light-transmitting film disposed on an inner wall of the through-hole and configured to block a lower end of the through-hole.

The control unit may acquire shape information and a GBIR (Global Backside reference Indicate Reading) of the polished wafer at each predetermined period, and may determine whether to perform a polishing process with respect to the polished wafer based on the acquired GBIR, and the GBIR may be a difference between a maximum value and a minimum value of thicknesses of the wafer that are measured at the predetermined period.

If a GBIR in a current period exceeds a GBIR in a previous period, the control unit may stop the polishing process with respect to the polished wafer.

The control unit may acquire information about a shape of the polished wafer based on coordinates of a movement path of a center of the carrier, coordinates of a movement path of a center of the wafer received in the carrier, and distances from the center of the wafer to points of the wafer at which the thicknesses thereof are measured by the sensor unit.

In another embodiment, a wafer polishing method using a wafer polishing apparatus including a lower surface plate, an upper surface plate, and a sensor unit configured to rotate together with the upper surface plate, includes starting a double-side polishing process with respect to a wafer loaded on at least one carrier disposed on the lower surface plate and measuring a thickness of the wafer that is being polished using the sensor unit, determining whether the thickness of the wafer that is being polished has reached a predetermined reference thickness, upon determining that the thickness of the wafer that is being polished has reached the reference thickness, acquiring information about a shape of the wafer at a predetermined period, calculating a GBIR (Global Backside reference Indicate Reading) of the wafer using the acquired information about the shape of the wafer, and determining whether to stop a double-side polishing process with respect to the wafer based on the calculated GBIR.

The acquiring the information about the shape of the wafer may include measuring the thicknesses of the wafer that is being polished at a plurality of random thickness measurement points at the predetermined period, and acquiring a thickness profile of the wafer in a radial direction of the wafer based on the measured thicknesses of the wafer that is being polished.

The determining whether to stop the double-side polishing process with respect to the wafer may include, if a GBIR of the wafer in a first period exceeds a GBIR of the wafer in a second period, stopping the double-side polishing process with respect to the wafer, and the first period and the second period may be periods that are defined after a time point at which a thickness of the wafer that is being polished has reached the reference thickness, and the first period may be a predetermined period that follows the second period.

If the GBIR of the wafer in the first period does not exceed the GBIR of the wafer in the second period, information about the shape of the wafer may be acquired at a next predetermined period, the GBIR of the wafer may be calculated using the acquired information about the shape of the wafer, and it may be determined whether to stop the double-side polishing process with respect to the wafer based on the calculated GBIR.

The determining whether to stop the double-side polishing process with respect to the wafer may include, if a GBIR of the wafer in a first period is greater than or equal to a GBIR of the wafer in a second period, stopping the double-side polishing process with respect to the wafer, and the first period and the second period may be periods that are defined after a time point at which a thickness of the wafer that is being polished has reached the reference thickness, and the first period may be a predetermined period that follows the second period.

Advantageous Effects

Embodiments are capable accurately measuring the thickness of a wafer that is being polished and of improving the polishing quality of the wafer.

BEST MODE

Figure 1:
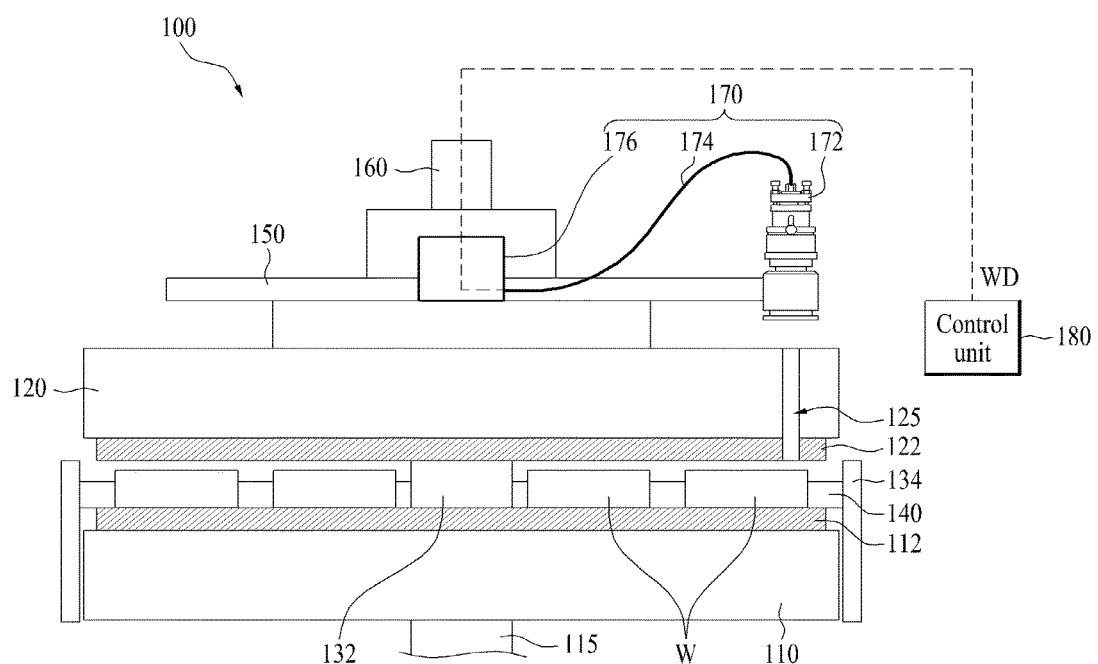
FIG. 1 illustrates a sectional view of a double-side polishing apparatus according to an embodiment.

Hereinafter, embodiments will be described in detail with reference to the accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer is described with reference to the drawings.

The size of each layer shown in the drawings may be exaggerated, omitted or schematically drawn for the purpose of convenience or clarity. In addition, the size of elements does not utterly reflect an actual size thereof. In addition, the same reference numbers will be used throughout the drawings to refer to the same or like parts.

FIG. 1 illustrates a sectional view of a double-side polishing apparatus 100 according to an embodiment.

Referring to FIG. 1, the double-side polishing apparatus 100 may include a lower surface plate 110, a first polishing pad 112, a lower-surface-plate-rotating unit 115, an upper surface plate 120, a second polishing pad 122, a sun gear 132, an internal gear 134, at least one carrier 140, a slurry supply unit 150, an upper-surface-plate-rotating unit 160, a sensor unit 170, and a control unit 180.

The lower surface plate 110 may serve to support a wafer W that has been loaded on or received in the at least one carrier 140, and may have the shape of an annular circular plate having a hollow portion. The first polishing pad 112 for polishing the wafer may be mounted or attached to the upper surface of the lower surface plate 110.

The lower-surface-plate-rotating unit 115 is disposed under the lower surface plate 110 and rotates the lower surface plate 110.

The lower-surface-plate-rotating unit 115 may include a first rotating shaft to rotate the lower surface plate 110, and the first rotating shaft may rotate the lower surface plate 110 clockwise or counterclockwise.

In an example, the first rotating shaft may be rotated by rotation of a driving motor (not shown), and the lower surface plate 110 may be rotated clockwise or counterclockwise together with the first rotating shaft.

The upper surface plate 120 may be disposed above the lower surface plate 110 such that the lower surface of the upper surface plate 120 faces the upper surface of the lower surface plate 110, and may have the shape of an annular circular plate having a hollow portion. The second polishing pad 122 for polishing the wafer may be mounted or attached to the lower surface of the upper surface plate 120.

The upper surface plate 120 may have a through-hole 125 formed therein, through which light radiated from the sensor unit 170 passes, which will be described later. For example, the through-hole 125 may be formed through the upper surface plate 120 and the second polishing pad 122.

A light-transmitting film 310, which allows light to pass therethrough, may be disposed in the through-hole 125 in the upper surface plate 120.

Figure 5:
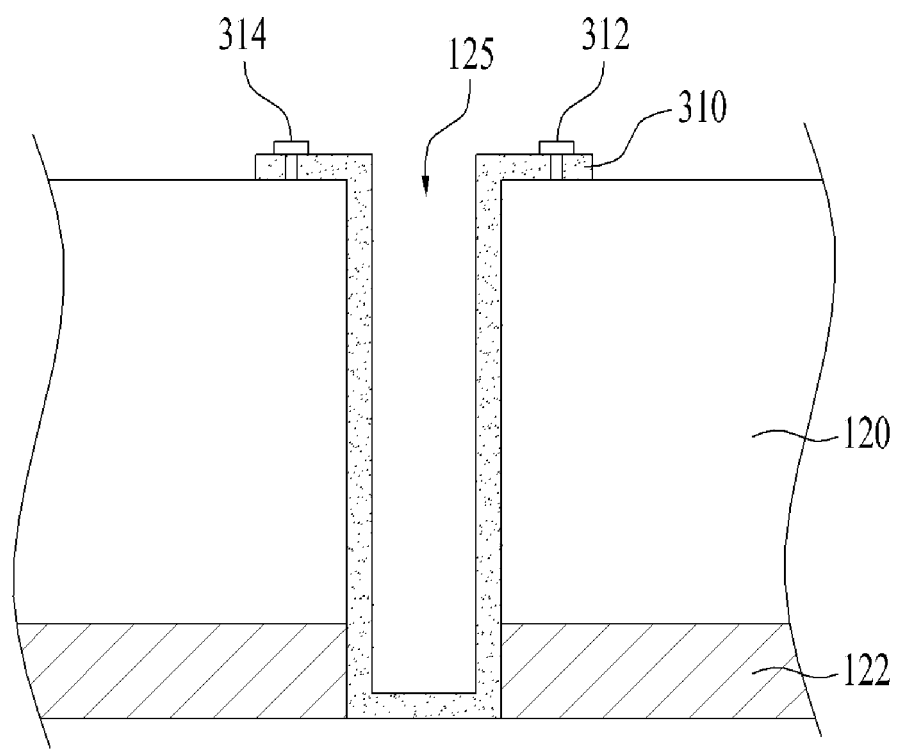
FIG. 5 illustrates an enlarged view of a light-transmitting film according to the embodiment.

FIG. 5 illustrates an enlarged view of the light-transmitting film 310 according to the embodiment.

Referring to FIG. 5, the light-transmitting film 310 may be disposed on the inner wall of the through-hole 125 and may also block the lower end of the through-hole 125.

In an example, one end of the light-transmitting film 310 may be secured to a portion of the upper surface of the upper surface plate 120 that is located in the vicinity of the through-hole 125 by means of fastening members 312 and 314. In an example, the fastening members 312 and 314 may be screws, but the disclosure is not limited thereto.

The light-transmitting film 310 may be attached to the inner wall of the through-hole 125 using a piece of double-sided adhesive tape or an adhesive agent, and the opposite end of the light-transmitting film 310 may block the lower end of the through-hole 125. The light-transmitting film 310 may be light-transmissive plastic, for example, transparent PVC, but the disclosure is not limited thereto.

The slurry supply unit 150 is disposed on the upper surface plate 120, and supplies slurry to the upper surface plate 120. The slurry supply unit 150 may be connected to the upper surface of the upper surface plate 120 and may be rotated together with the upper surface plate 120. The upper surface plate 120 may have a slurry supply line (not shown) formed thereinside, through which the slurry supplied from the slurry supply unit 150 flows, and the slurry may be supplied to the wafer loaded on the at least one carrier 140 through the slurry supply line.

The upper-surface-plate-rotating unit 160 may serve to rotate the upper surface plate 120 and may also move the upper surface plate 120 up and down.

The upper-surface-plate-rotating unit 160 may be connected to the slurry supply unit 150, and may include a second rotating shaft to rotate the upper surface plate 120.

In an example, the second rotating shaft may be connected to the upper surface of the slurry supply unit 150, and may rotate the slurry supply unit 150 and the upper surface plate 120 clockwise or counterclockwise at the same time. In an example, the second rotating shaft may be connected to the driving motor (not shown), the second rotating shaft may be rotated by the rotation of the driving motor, and the upper surface plate 120 may be rotated clockwise or counterclockwise together with the second rotating shaft.

The upper-surface-plate-rotating unit 160 may adjust the load of the upper surface plate 110 applied to the wafer W loaded on the at least one carrier 140 by moving the upper surface plate 120 up and down.

In an example, the second rotating shaft may be connected to a pneumatic or hydraulic cylinder (not shown), and the load of the top surface plate 120 applied to the wafer W loaded on the at least one carrier 140 may be adjusted using the pneumatic or hydraulic cylinder.

The sun gear 132 may be disposed in the hollow portion of the lower surface plate 110, and may be embodied as a pin gear including a plurality of first pins.

The internal gear 134 may be disposed around the edge of the lower surface plate 110. In an example, the internal gear 134 may have the shape of an annular circular plate, the inner circumferential surface of which surrounds the outer circumferential surface of the edge of the lower surface plate 110. The internal gear 134 may be embodied as a pin gear including a plurality of second pins.

The at least one carrier 140 may be disposed on the upper surface of the lower surface plate 110, and may allow a wafer W to be polished to be received therein or to be loaded thereon. In an example, the at least one carrier 140 may be disposed between the first polishing pad 112 on the lower surface plate 110 and the second polishing pad 122 on the upper surface plate 120.

The at least one carrier 140 may include a carrier body, which has a wafer-mounting hole (not shown) for receiving a wafer W therein and at least one slurry hole spaced apart from the wafer-mounting hole and configured to allow the slurry to pass therethrough, and a gear, which is provided on the outer circumferential surface of the carrier body. The at least one carrier 140 may be formed of an epoxy glass, SUS, urethane, ceramic or polymer material.

The carrier body may have a circular plate shape, but the disclosure is not limited thereto. The gear provided on the outer circumferential surface of the edge of the carrier 140 may be engaged with the first pins of the sun gear 132 and the second pins of the internal gear 134. In the polishing process, the at least one carrier 140 may perform rotation in engagement with the sun gear 132 and the internal gear 134.

The sensor unit 170 is secured to the slurry supply unit 150, is rotated together with the slurry supply unit 150 and the upper surface plate 120, radiates light to the wafer W received in the at least one carrier 140 through the through-hole 125 in the upper surface plate 120, detects the light reflected by the wafer W, and outputs detection data WD based on the detection result.

In an example, the light radiated from the sensor unit 170 may be a laser, but the disclosure is not limited thereto.

The sensor unit 170 includes a thickness-measuring sensor 172, a cable 174, and a rotary connector 176.

The thickness-measuring sensor 172 may be secured to the slurry supply unit 150 so as to be aligned with the through-hole 125, may be rotated together with the slurry supply unit 150 and the upper surface plate 120, may radiate light to the wafer W through the through-hole 125, may detect the light reflected by the wafer W, and may output detection data DW based on the detection result.

In an example, the thickness-measuring sensor 172 may include an optical unit for radiating light (for example, a laser) and a photodetector for detecting the laser reflected by the wafer W.

The center of the thickness-measuring sensor 172 may be aligned with the center of the through-hole 125. In an example, the light (for example, the laser) radiated from the optical unit may be aimed at the center of the through-hole 125 so as to be aligned therewith, thereby accurately measuring the thickness.

The thickness-measuring sensor 172 may detect the light reflected from the surface of the wafer W and the light reflected after passing through the wafer W, and may output detection data WD about the thickness of the wafer based on the detection result.

The cable 174 connects the thickness-measuring sensor 172 to the control unit 180 via the rotary connector 176, and the detection data WD about the thickness of the wafer, detected by the photodetector of the thickness-measuring sensor 172, is transmitted to the control unit 180 through the cable 174.

The rotary connector 176 is connected to the cable 174, and may serve to prevent the cable 174 from being twisted when the thickness-measuring sensor 172 rotates. The rotary connector 176 may be formed to have a bearing configuration, and may allow the cable 174 to rotate together with the upper surface plate 120, thereby preventing the occurrence of interference between the cable 174 and the thickness-measuring sensor 172.

Figure 4:
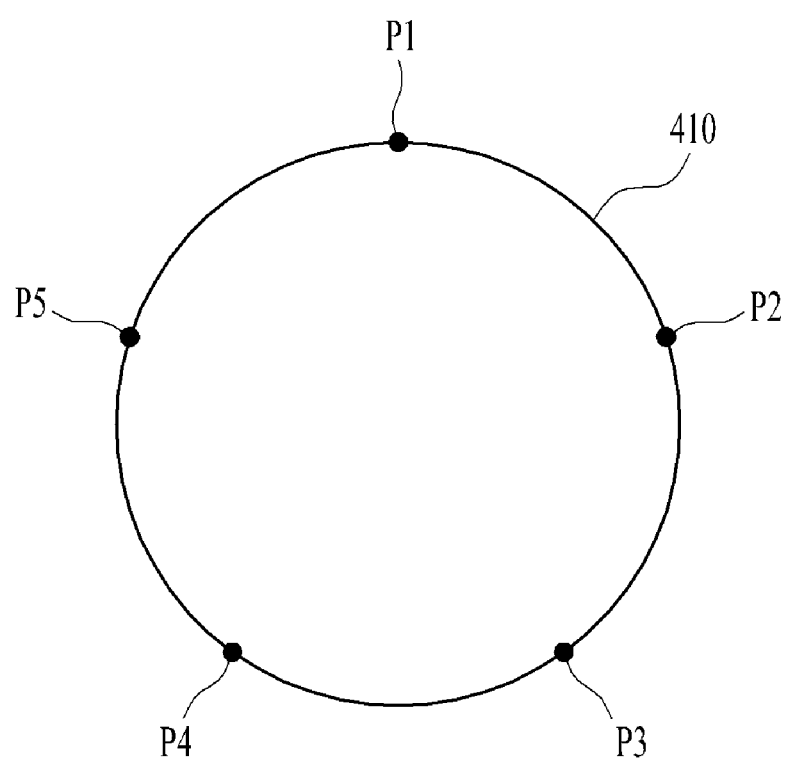
FIG. 4 illustrates the amount of data acquired by a fixed-type thickness-measuring sensor and a rotary-type thickness-measuring sensor.

FIG. 4 illustrates the amount of data acquired by a fixed-type thickness-measuring sensor and a rotary-type thickness-measuring sensor.

The fixed-type thickness-measuring sensor is fixedly mounted, and is thus independent of rotation of the upper surface plate, and the upper surface plate has a plurality of through-holes formed therein. When the upper surface plate rotates in the polishing process, the fixed-type thickness-measuring sensor may achieve laser radiation and detection of reflected light through the through-holes formed in the upper surface plate.

Referring to FIG. 4, in the case of a fixed-type thickness-measuring sensor, positions P1 to P5, at which detection data is acquired, may correspond to the through-holes formed so as to be spaced apart from each other in the upper surface plate.

On the other hand, as described with reference to the embodiment, the rotary-type thickness-measuring sensor 172, which is configured to rotate together with the upper surface plate 120, may achieve nearly constant acquisition 410 of detection data through the single through-hole 125.

The control unit 180 calculates the thickness of the wafer based on the detection data WD about the thickness of the wafer, which is transmitted through the cable 174.

For example, the control unit 180 may measure the thickness of the wafer W using the phase difference between the light reflected from the surface of the wafer W and the light reflected after passing through the wafer W.

Because the thickness-measuring sensor 172 rotates simultaneously with the upper surface plate 120, it is possible to acquire successive detection data about the thickness of the wafer through the single through-hole 125, and accordingly, the embodiment is capable of accurately measuring the thickness of the wafer.

Figure 2:
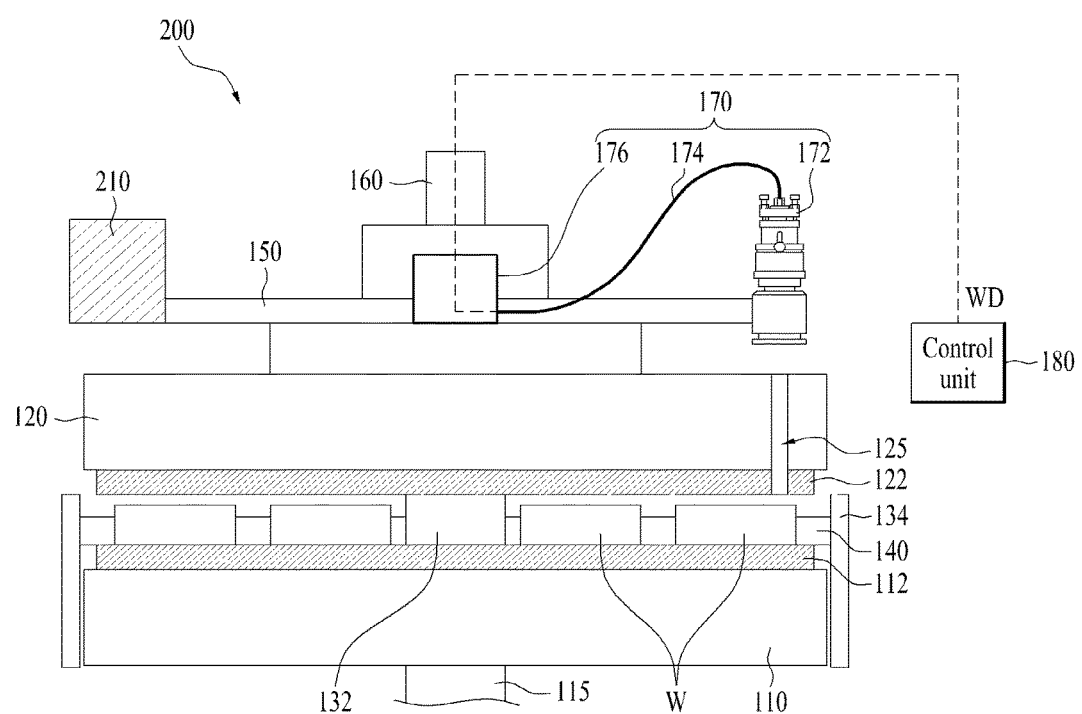
FIG. 2 illustrates a sectional view of a double-side polishing apparatus according to another embodiment.

FIG. 2 illustrates a sectional view of a double-side polishing apparatus 200 according to another embodiment. The same reference numerals as those in FIG. 1 denote the same constituent components, and an explanation thereof will be made briefly or omitted.

Referring to FIG. 2, the double-side polishing apparatus 200 may further include a load-compensating unit 210 that is added to the double-side polishing apparatus 100 shown in FIG. 1.

The load-compensating unit 210 may be secured to a region of the slurry supply unit 150 that is opposite the region of the slurry supply unit 150 to which the thickness-measuring sensor 172 is secured. The weight of the load-compensating unit 210 may be equal to the weight of the thickness-measuring sensor 172.

The load-compensating unit 210 may prevent the load of the upper surface plate 120 from being biased in any one direction due to the thickness-measuring sensor 172.

Figure 3:
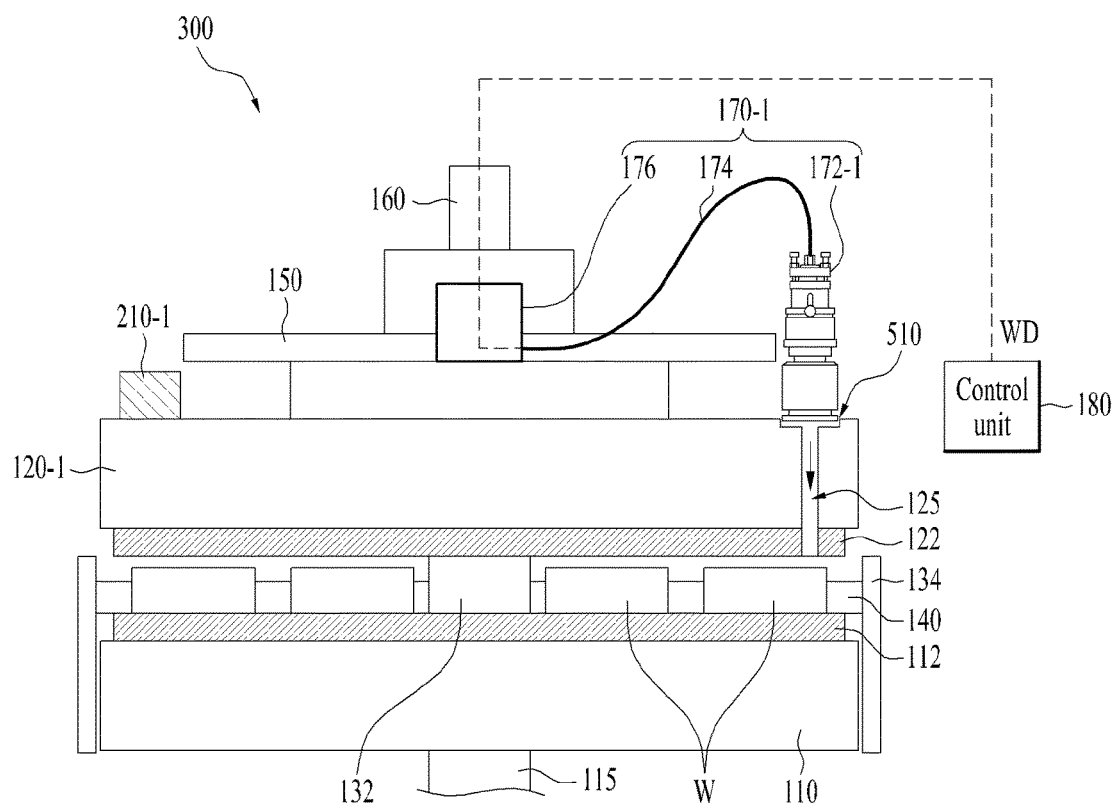
FIG. 3 illustrates a sectional view of a double-side polishing apparatus according to another embodiment.

FIG. 3 illustrates a sectional view of a double-side polishing apparatus 300 according to another embodiment.

The same reference numerals as those in FIG. 1 denote the same constituent components, and an explanation thereof will be made briefly or omitted.

Referring to FIG. 3, the double-side polishing apparatus 300 may include a lower surface plate 110, a first polishing pad 112, a lower-surface-plate-rotating unit 115, an upper surface plate 120, a second polishing pad 122, a sun gear 132, an internal gear 134, at least one carrier 140, a slurry supply unit 150, an upper-surface-plate-rotating unit 160, a sensor unit 170-1, a control unit 180, and a load-compensating unit 210-1.

The thickness-measuring sensor 172 of the embodiment 100 shown in FIG. 1 is secured to the slurry supply unit 150, but a thickness-measuring sensor 172-1 of the sensor unit 170-1 of the embodiment shown in FIG. 3 may be spaced apart from the slurry supply unit 150 and may be fixedly disposed on the upper surface of the upper surface plate 120.

The thickness-measuring sensor 172-1 may be secured to the upper surface of the upper surface plate 120-1 so as to rotate together with the upper surface plate 120-1, may radiate light to the wafer W through the through-hole 125, may detect the light reflected by the wafer W, and may output detection data DW based on the detection result.

Further, while the load-compensating unit 210 of the embodiment 200 shown in FIG. 2 is secured to the slurry supply unit 150, the load-compensating unit 210-1 of the embodiment 300 shown in FIG. 3 may be secured to the upper surface of the upper surface plate 120-1.

In an example, the load-compensating unit 210-1 may be secured to a region that is opposite the region of the upper surface of the upper surface plate 120-1 to which the thickness-measuring sensor 172-1 is secured.

A recess 510, in which one end of the thickness-measuring sensor 172-1 is insertedly disposed, may be formed in the upper surface of the upper surface plate 120-1.

Figure 6:
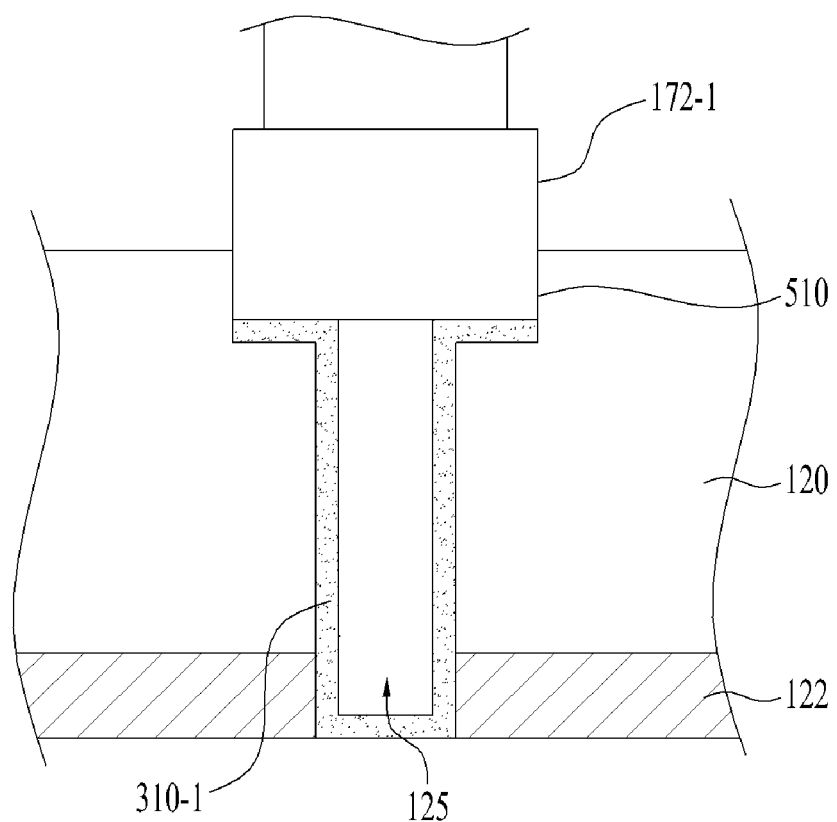
FIG. 6 illustrates an enlarged view of a recess shown in FIG. 3.

FIG. 6 illustrates an enlarged view of the recess 510 shown in FIG. 3.

Referring to FIG. 6, the recess 510 may be formed in a region that is close to the edge of the upper surface of the upper surface plate 120-1. The through-hole 125 may be formed through the bottom of the recess 510 and the upper surface plate 120, and the center of the recess 510 may be aligned with the center of the through-hole 125, but the disclosure is not limited thereto.

As described with reference to FIG. 6, a light-transmitting film 310-1 may be disposed on the bottom of the recess 510 and the inner wall of the through-hole 125, and may cover or block the lower end of the through-hole 125.

A lower end portion of the thickness-measuring sensor 172-1 may be inserted into the recess 510 and may be supported by the bottom of the recess 510. An adhesive member (not shown) may be disposed between the lower end portion of the thickness-measuring sensor 172-1 and the recess 510.

When the upper surface plate 120-1 rotates, the recess 510 in the upper surface plate 120-1 may serve to support or affix the thickness-measuring sensor 172-1.

In order to prevent the load of the upper surface plate 120-1 from being biased in any one direction due to the thickness-measuring sensor 172-1 secured to the upper surface of the upper surface plate 120-1, the load-compensating unit 210-1 may be secured to a region that is opposite the region of the upper surface of the upper surface plate 120-1 at which the thickness-measuring sensor 172-1 is positioned. The weight of the load-compensating unit 210-1 may be the same as the weight of the thickness-measuring sensor 172-1.

Since the double-side polishing apparatus 100, 200 or 300 according to the embodiment includes the rotary-type thickness-measuring sensor 172 configured to rotate together with the upper surface plate 120 and is capable of achieving successive acquisition 410 of detection data through the single through-hole 125 by virtue of the rotary-type thickness-measuring sensor 172, it is possible to accurately measure the thickness of a wafer that is being polished during the polishing process.

The control unit 180 may accurately measure the thickness of a wafer during the double-side polishing process using the detection data about the thickness of the wafer, which is transmitted from the sensor unit 170 of the double-side polishing apparatus 100, 200 or 300 according to the embodiment, and consequently, may enable the wafer to be polished so as to be less influenced by various causes of deterioration in GBIR during the polishing process.

First, causes affecting the shape of a wafer during the polishing process will be explained.

The shape of the wafer that is being polished during the double-side polishing process may be affected by a gap attributable to the thickness difference between the carrier and the wafer.

Figure 12:
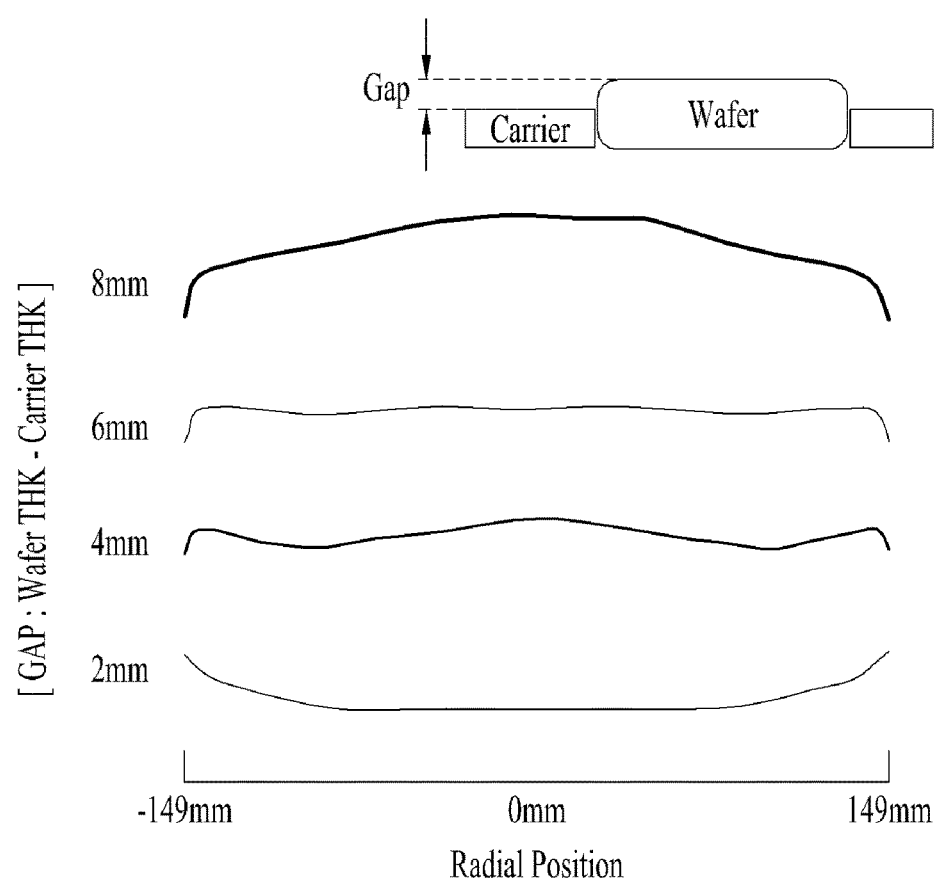
FIG. 12 illustrates a gap attributable to the thickness difference between the carrier and the wafer and the difference in the shapes of wafers in accordance with the gap.

FIG. 12 illustrates the gap attributable to the thickness difference between the carrier and the wafer and the difference in the shapes of wafers in accordance with the gap.

Referring to FIG. 12, the larger the gap attributable to the thickness difference between the carrier and the wafer, the more strongly convex the shape of the wafer may be. Conversely, the smaller the gap attributable to the thickness difference between the carrier and the wafer, the more strongly concave the shape of the wafer may be.

For example, if the gap is greater than or equal to 6 mm, the polished wafer may have a convex shape, and if the gap is less than 6 mm, at least a portion of the polished wafer may have a concave shape.

Further, as the wafer is polished, the shape of the polished wafer that is being polished may be affected by abrasion of the carrier, variation of the surface of the polishing pad, variation in the material properties of the slurry, or various other causes. Deterioration in GBIR may be increased by the above-mentioned causes.

Although the shape of the wafer that is being polished is affected by the above-mentioned causes, it is possible to measure a GBIR in accordance with the thickness of the wafer that is being polished and to obtain the thickness of the polished wafer having an optimal GBIR based on the measurement result.

Figure 13:
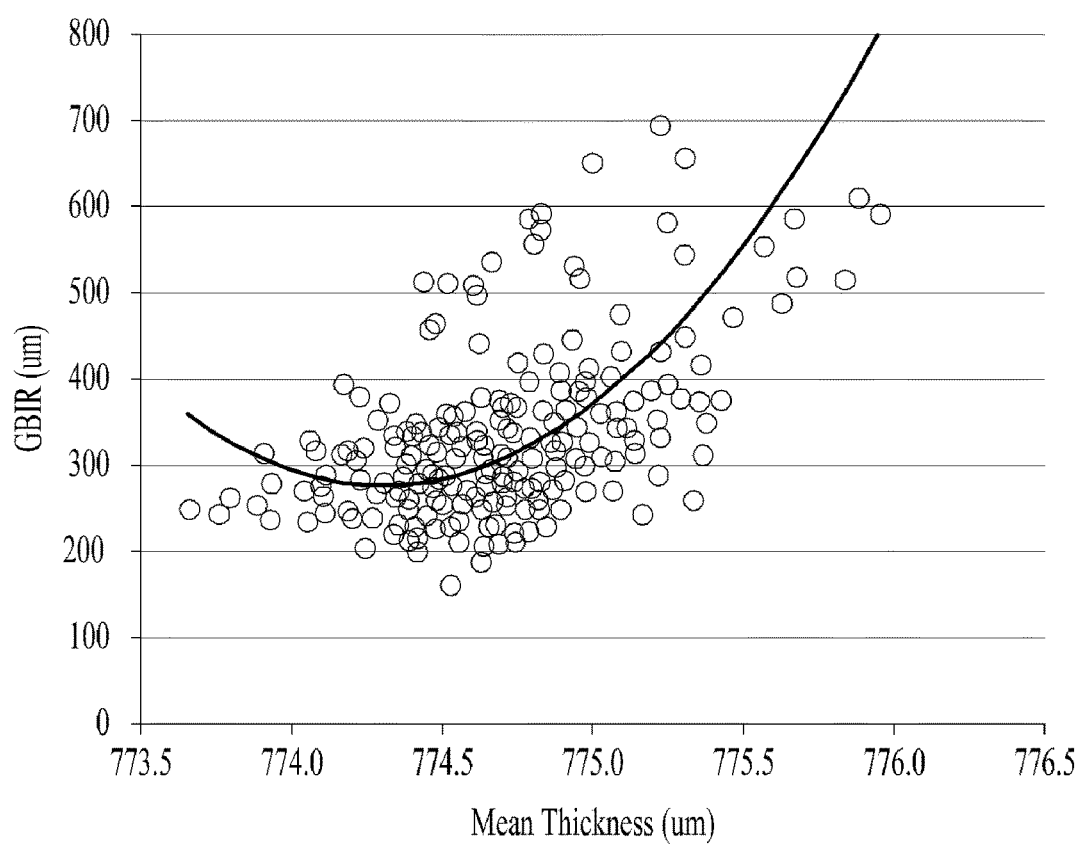
FIG. 13 is a graph illustrating the relationship between a mean thickness and a GBIR of the polished wafer.

FIG. 13 is a graph illustrating the relationship between the mean thickness and the GBIR of the polished wafer.

Referring to FIG. 13, it can be known that when the mean thickness of the polished wafer is in the range from 774 μm to 774.5 μm, the value of GBIR is small. In addition, it can be known that the mean thickness of the polished wafers having a small GBIR value primarily falls within the range from 774 μm to 774.5 μm.

As the wafer is polished, in order to decrease deterioration in GBIR due to causes affecting the shape of the wafer that is being polished, it is necessary to vary the optimum polishing thickness of the wafer in accordance with the circumstances.

In a double-side polishing method according to the embodiment using the double-side polishing apparatus 100 shown in FIG. 1, which is capable of precisely adjusting the polishing thickness, variation in the shape of the wafer during the polishing process is monitored, and the double-side polishing process is terminated when the thickness of the polished wafer exhibits the lowest GBIR value within process maintenance criteria.

The control unit 180 may acquire shape information and a GBIR of the polished wafer at each predetermined period, and may determine whether to further perform the polishing process with respect to the polished wafer based on the acquired GBIR value.

Figure 7:
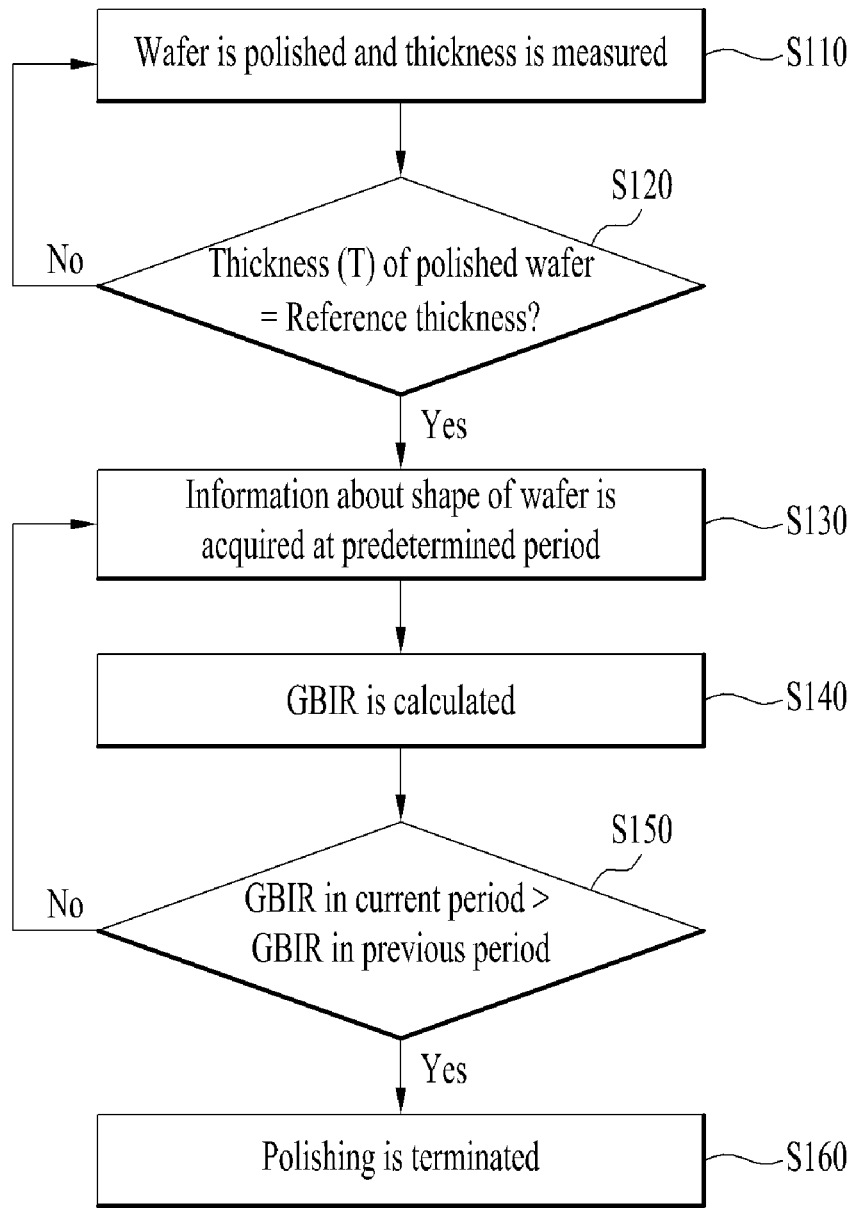
FIG. 7 is a flowchart illustrating a double-side polishing method according to the embodiment.
Figure 8:
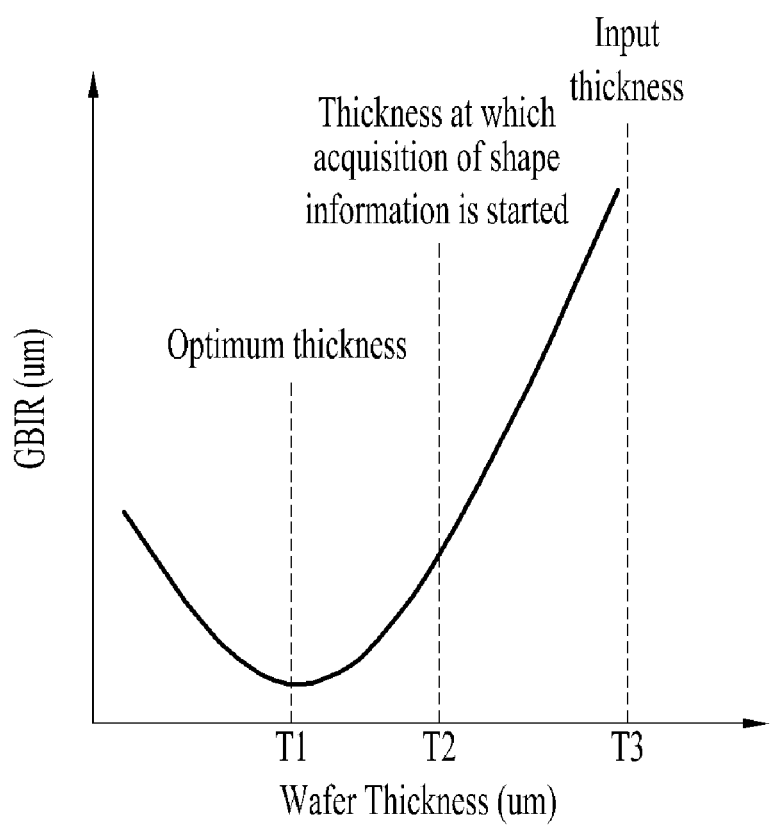
FIG. 8 illustrates variation in GBIR in accordance with variation in the thickness of a wafer that is being polished.

FIG. 7 is a flowchart illustrating the double-side polishing method according to the embodiment, and FIG. 8 illustrates variation in GBIR in accordance with variation in the thickness of the wafer that is being polished.

Referring to FIGS. 7 and 8, based on the detection data provided through the thickness-measuring sensor 170 of the double-side polishing apparatus 100, 200 or 300, the control unit 180 starts the double-side polishing process with respect to the wafer W loaded on the at least one carrier 140 disposed on the lower surface plate 110, and at the same time measures the thickness of the wafer that is being polished (S110). For example, the thickness of the wafer that is measured in step S110 may be the mean thickness of the wafer.

It can be known from FIG. 8 that when the wafer has an initial thickness T3 before being polished, the value of GBIR is the largest.

Subsequently, the control unit 180 determines whether the thickness of the polished wafer has reached a predetermined reference thickness T2 (S120). Here, the reference thickness T2 may be the maximum thickness that meets the process maintenance criteria.

If the thickness of the polished wafer has not reached the predetermined reference thickness T2, the double-side polishing process and the thickness-measuring process are further performed with respect to the wafer.

If the thickness of the polished wafer has reached the reference thickness T2, the control unit 180 acquires information about the shape of the wafer at a predetermined period (S130).

For example, the control unit may acquire information about the shape of the wafer based on the thicknesses of the wafer that are measured by the thickness-measuring sensor 172 of the double-side polishing apparatus 100, 200 or 300 according to the embodiment at each predetermined period from the time point at which the thickness of the polished wafer has reached the reference thickness T2. Here, the predetermined period may be the time taken for the wafer to be polished by a thickness ranging from 0.2 μm to 0.3 μm, for example, 30 seconds to 1 minute, but the disclosure is not limited thereto. For example, the thicknesses of the wafer measured at step S130 may be the thicknesses at various measurement points of the wafer.

After the thicknesses of the wafer are measured by the thickness-measuring sensor 172 of the double-side polishing apparatus 100, 200 or 300 according to the embodiment at the predetermined period, a thickness profile of the wafer in the radial direction may be acquired based on the measurement result.

For example, the control unit 180 may acquire information about the shape of the polished wafer based on coordinates of a movement path of the center of the carrier 140, coordinates of a movement path of the center of the wafer W received in the carrier 140, and distances (for example, R1 and R2) from the center of the wafer W to points of the wafer at which the thicknesses thereof are measured by the thickness-measuring sensor 172.

The movement path of the center of the carrier 140 may be controlled by the sun gear 132 and the internal gear 134, the movement path of the center of the wafer that is being polished may be controlled by controlling the movement path of the center of the carrier 140, and the movement path of the center of the wafer that is being polished may be estimated or calculated.

The movement path of the center of the wafer W mounted to the carrier 140 may be estimated by controlling the movement path of the center of the carrier 140 using the sun gear 132 and the internal gear 134.

Figure 9A:
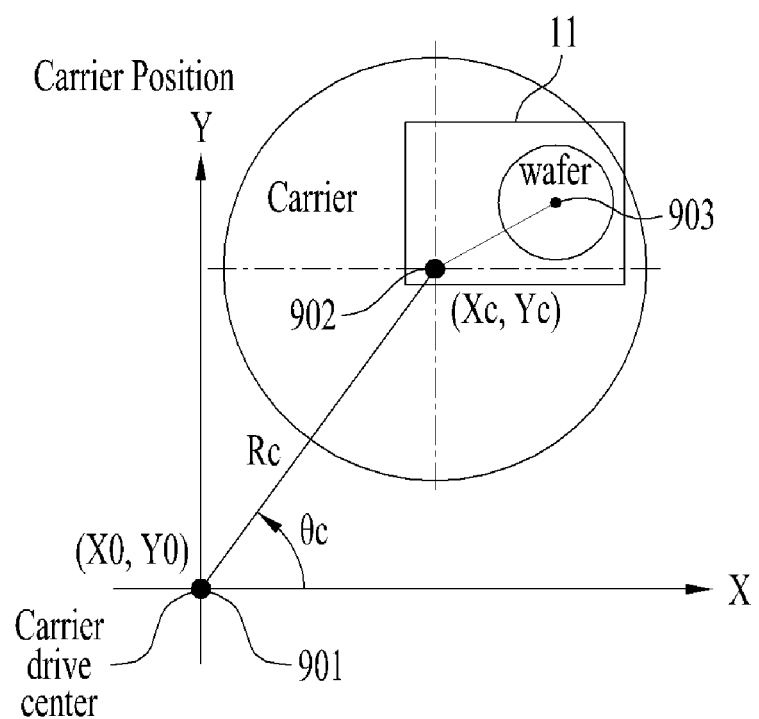
FIG. 9A illustrates a movement path of the center of a carrier during a double-side polishing process.

FIG. 9A illustrates the movement path of the center 902 of the carrier during the double-side polishing process.

The coordinates of the movement paths of the carrier and the wafer may be expressed in an XY-coordinate system, and an origin point 901 of the XY-coordinate system, in which the movement paths of the carrier and the wafer are expressed, may be a coordinate (X0,Y0), which corresponds to the carrier drive center, for example, the sun gear 132.

Referring to FIG. 9A, the movement path (Xc,Yc) of the center 902 of the carrier may be calculated from the following equations 1 to 3.

$$\theta c = \frac{Vc}{60} \times 2\pi \times t \qquad \text{Equation 1}$$

$$Xc = X0 + Rc \times \cos(\theta c) \qquad \text{Equation 2}$$

$$Yc = Y0 + Rc \times \sin(\theta c) \qquad \text{Equation 3}$$

Vc may be the rotating speed (for example, RPM) of the carrier, t may be a time (for example, seconds), and Rc may be the distance from the origin point 901 to the center 902 of the carrier.

Figure 9B:
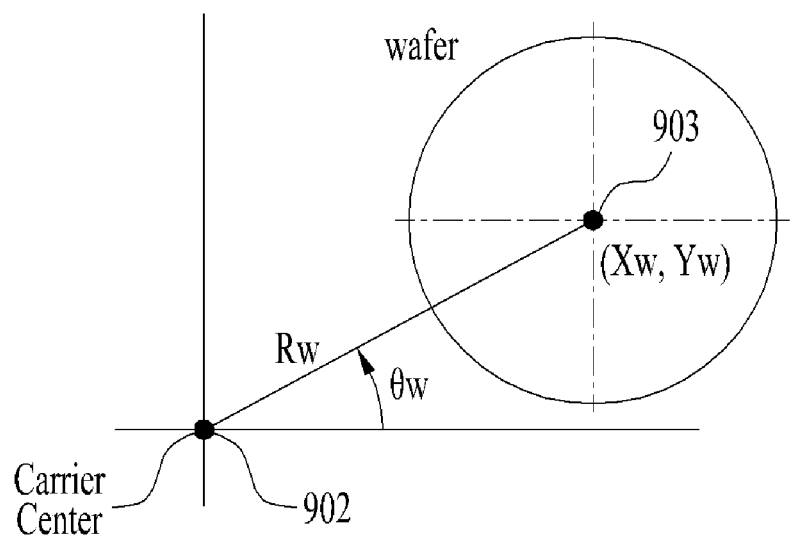
FIG. 9B illustrates a movement path of the center of the wafer mounted to the carrier shown in FIG. 9A.

FIG. 9B illustrates the movement path of the center 903 of the wafer mounted to the carrier shown in FIG. 9A.

Referring to FIG. 9B, the movement path (Xw,Yw) of the center 903 of the wafer may be calculated from the equations 4 to 6.

$$\theta w = \frac{Vc}{60} \times 2\pi \times t \qquad \text{Equation 4}$$

$$Xw = Xc + Rw \times \cos(\theta w) \qquad \text{Equation 5}$$

$$Yw = Yc + Rw \times \sin(\theta w) \qquad \text{Equation 6}$$

Rw may be the distance from the center 902 of the carrier to the center 903 of the wafer. Vc and t may be the same as described with reference to FIG. 9A.

Figure 10:
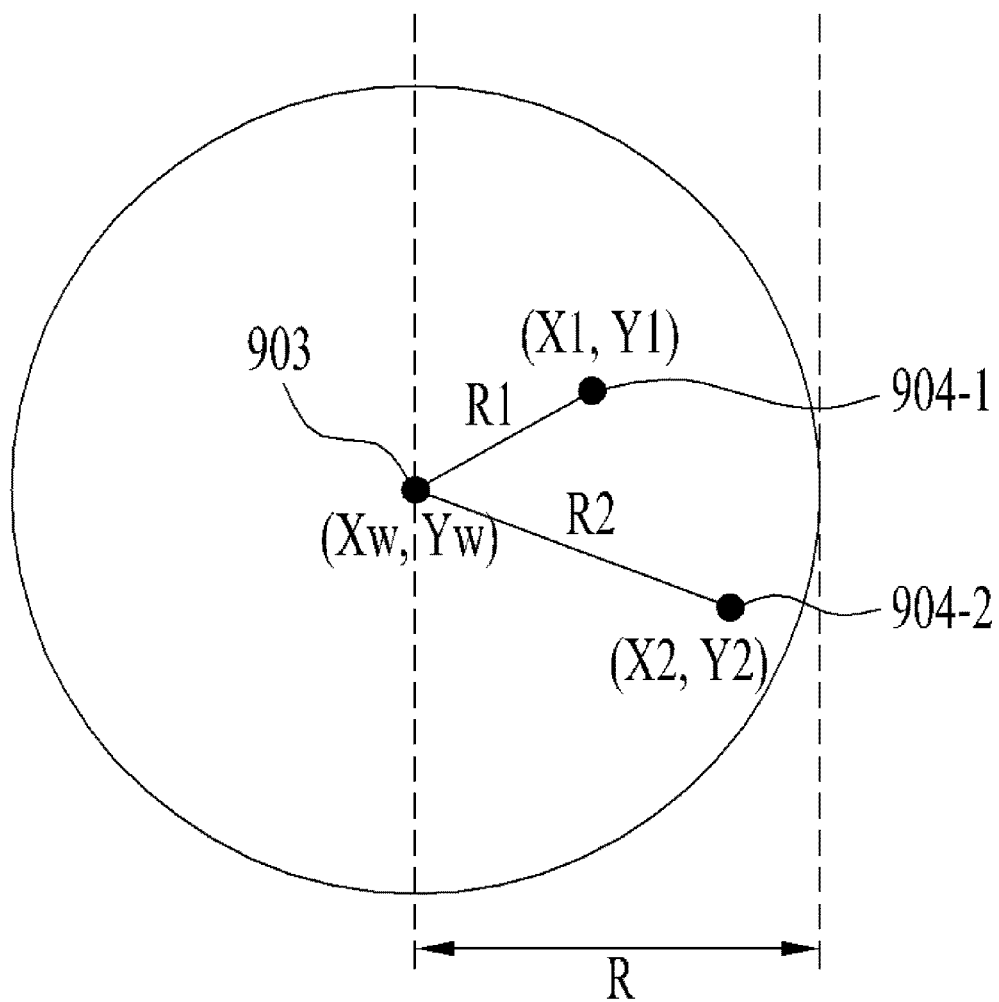
FIG. 10 illustrates points of the wafer at which the thicknesses thereof are measured by the thickness-measuring sensor according to the embodiment.

FIG. 10 illustrates points 904-1 and 904-2 of the wafer at which the thicknesses thereof are measured by the thickness-measuring sensor 172 according to the embodiment. Although only two thickness measurement points 904-1 and 904-2 are illustrated in FIG. 10, the thickness-measuring sensor 172 may actually measure the thicknesses of the wafer at a plurality of random thickness measurement points at the predetermined period.

Here, the thickness measurement point may be a region of the wafer at which the thickness thereof is measured through the through-hole 125.

Referring to FIG. 10, it is possible to calculate the distances R1 and R2 from the center 903 of the wafer to the thickness measurement points 904-1 and 904-2 of the wafer using the coordinates (Xc,Yc) of the movement path of the center of the carrier and the coordinates (Xw,Yw) of the movement path of the center 903 of the wafer.

For example, the coordinates (Xw,Yw) of the movement path of the center of the wafer may be calculated using the coordinates (Xc,Yc) of the movement path of the center of the carrier, and the distances R1 and R2 from the center 903 of the wafer to the thickness measurement points 904-1 and 904-2 may be calculated using the coordinates (Xw,Yw) of the movement path of the center of the wafer and the coordinates ((X1,Y1), (X2,Y2)) of the thickness measurement points 904-1 and 904-2.

Although the thicknesses of the wafer are measured at random by the thickness-measuring sensor 172, since it is possible to calculate the distances (for example, R1 and R2) from the center 903 of the wafer to the thickness measurement points 904-1 and 904-2 of the wafer, a thickness profile of the wafer in the radial direction thereof may be acquired, and consequently, information about the shape of the wafer may be acquired. For example, the radial direction of the wafer may be a direction oriented from the center of the wafer to the edge of the wafer.

Figure 11:
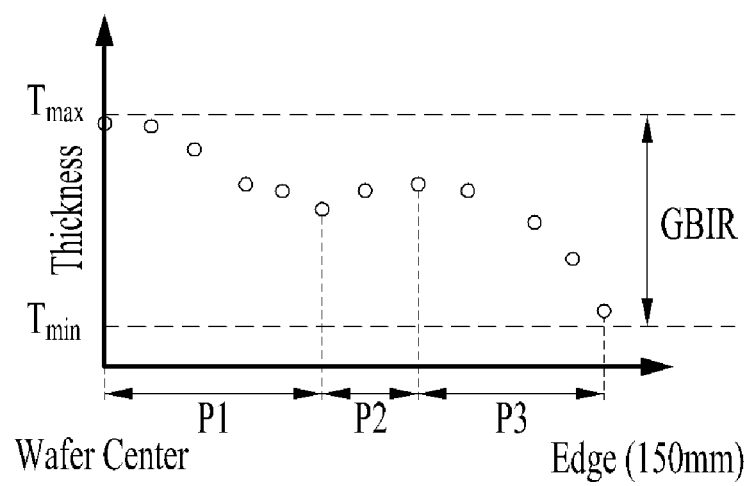
FIG. 11 illustrates a thickness profile and a GBIR in the radial direction of the wafer.

FIG. 11 illustrates the thickness profile and the GBIR in the radial direction of the wafer.

Referring to FIG. 11, information about the shape of the wafer (the thickness profile of the wafer) may be acquired by arranging the thicknesses of the wafer, measured at random thickness measurement points using the thickness-measuring sensor 172 of the embodiment at the predetermined period, along the distances (for example, R1 and R2) from the center of the wafer to the thickness measurement points. For example, the predetermined period may be the time taken for the wafer to be polished by a thickness ranging from 0.2 μm to 0.3 μm, for example, 30 seconds to 1 minute, but the disclosure is not limited thereto.

Subsequently, the GBIR of the wafer is calculated using the acquired information about the shape of the wafer (S140).

The GBIR (Global Backside reference Indicate Reading) denotes the overall flatness of the wafer, and is a value indicating the overall thickness deviation of the wafer, which is calculated by subtracting the minimum thickness from the maximum thickness of the wafer.

Referring to FIG. 7, the GBIR of the wafer in the predetermined period may be a difference between a maximum value Tmax [μm] and a minimum value Tmin [μm] of the thicknesses of the polished wafers that are measured at the predetermined period.

Subsequently, it is determined whether to stop the double-side polishing process with respect to the wafer based on the calculated GBIR of the wafer.

The GBIR of the wafer in a first period (a current period) and the GBIR of the wafer in a second period (a previous period) are compared with each other (S150). According to steps S120 and S130, it is possible to acquire information about the shape of the wafer at each predetermined period from a time point at which the thickness of the wafer that is being polished has reached the reference thickness and to calculate a GBIR. The first period and the second period may be predetermined periods that are defined after a time point at which the thickness of the wafer that is being polished has reached the reference thickness, and the first period may be a predetermined period that follows the second period.

For example, the GBIR of the wafer in the second period may be a GBIR that has been acquired at a predetermined period shortly after a time point at which the thickness of the polished wafer has reached the reference thickness, and the GBIR of the wafer in the first period may be a GBIR that has been acquired at a predetermined period that follows the second period.

If the GBIR of the wafer in the first period exceeds the GBIR of the wafer in the second period, the control unit 180 stops the double-side polishing process with respect to the wafer (S160).

Referring to FIG. 8, it can be known that, when the GBIR of the polished wafer is calculated at each predetermined period after the time point at which the thickness of the polished wafer has reached T2, the calculated GBIR is decreased until the thickness of the polished wafer becomes T3, and is then increased when the thickness of the polished wafer is decreased below T3.

Therefore, it can be known that the GBIR has the lowest value shortly before the GBIR of the wafer in the first period exceeds the GBIR of the wafer in the second period. As a result, the optimal thickness of the polished wafer, which exhibits the minimum GBIR, is T3, and the polishing process may be stopped at a time point at which the GBIR of the wafer in the first period exceeds the GBIR of the wafer in the second period.

Meanwhile, if the GBIR of the wafer in the first period does not exceed the GBIR of the wafer in the second period, information about the shape of the wafer may be acquired at the next predetermined period, and the GBIR of the wafer may be calculated based on the acquired information about the shape of the wafer (S150, S130 and S140).

According to another embodiment, if the GBIR of the wafer in the first period is greater than or equal to the GBIR of the wafer in the second period, the double-side polishing process with respect to the wafer may be stopped. Conversely, if the GBIR of the wafer in the first period is less than the GBIR of the wafer in the second period, information about the shape of the wafer may be acquired at the next predetermined period, and the GBIR of the wafer may be calculated based on the acquired information about the shape of the wafer (S150, S130 and S140).

Using the thickness-measuring sensor 172 capable of precisely measuring a thickness, the double-side polishing method according to the embodiment is capable of acquiring information about the shape of the wafer at each predetermined period and calculating a GBIR corresponding to each predetermined period based on the acquired shape information. In addition, the double-side polishing method according to the embodiment is capable of acquiring the thickness of the polished wafer that exhibits the lowest GBIR by comparing the GBIR in the current period with the GBIR in the previous period, thereby improving the polishing quality of the wafer.

The features, structures and effects and the like described in association with the embodiments above are incorporated into at least one embodiment of the present invention, but are not limited only to the one embodiment. Furthermore, the features, structures and effects and the like exemplified in association with respective embodiments can be implemented in other embodiments by combination or modification by those skilled in the art. Therefore, contents related to such combinations and modifications should be construed as falling within the scope of the present invention.

INDUSTRIAL APPLICABILITY

Embodiments are applicable to a wafer polishing process in a wafer manufacturing process.

The invention claimed is:

1. A wafer polishing apparatus comprising:
a lower surface plate;
an upper surface plate disposed above the lower surface plate and configured to rotate;
a carrier disposed on the lower surface plate to receive a wafer;
a sensor unit secured to an upper surface of the upper surface plate for radiating light to the wafer received in the carrier, detecting light reflected by the wafer, and outputting detection data based on a detection result; and
a load-compensating unit secured to a region of the upper surface of the upper surface plate that is opposite a region of the upper surface of the upper surface plate to which the sensor unit is secured,
wherein the upper surface plate has a through-hole to allow light radiated from the sensor unit to pass therethrough,
wherein the load-compensating unit has a same weight as the sensor unit, and
wherein the sensor unit rotates together with the upper surface plate.

2. The wafer polishing apparatus according to claim 1, further comprising:
a control unit for calculating a thickness of a polished wafer based on the detection data.

3. The wafer polishing apparatus according to claim 1, wherein the sensor unit includes:
a thickness-measuring sensor configured to rotate together with the upper surface plate and to output the detection data;
a cable for transmitting the detection data to the control unit; and
a rotary connector connected to the cable.

4. The wafer polishing apparatus according to claim 1, wherein the upper surface plate has a recess formed in the upper surface to allow one end of the sensor unit to be inserted in the recess, and the through-hole is formed through a bottom of the recess and the upper surface plate.

5. The wafer polishing apparatus according to claim 1, further comprising:
a light-transmitting film disposed on an inner wall of the through-hole and configured to block a lower end of the through-hole.

6. The wafer polishing apparatus according to claim 2, wherein the control unit acquires shape information and a GBIR (Global Backside reference Indicate Reading) of the polished wafer at each predetermined period, and determines whether to perform a polishing process with respect to the polished wafer based on the acquired GBIR, and
the GBIR is a difference between a maximum value and a minimum value of thicknesses of the wafer that are measured at the predetermined period.

7. The wafer polishing apparatus according to claim 6, wherein, if a GBIR in a current period exceeds a GBIR in a previous period, the control unit stops the polishing process with respect to the polished wafer.

8. The wafer polishing apparatus according to claim 6, wherein the control unit acquires information about a shape of the polished wafer based on coordinates of a movement path of a center of the carrier, coordinates of a movement path of a center of the wafer received in the carrier, and distances from the center of the wafer to points of the wafer at which the thicknesses are measured by the sensor unit.

9. The wafer polishing apparatus according to claim 3, wherein the thickness-measuring sensor includes an optical unit for radiating light and a photodetector for detecting light reflected by the wafer, and
light radiated from the optical unit is aimed at a center of the through-hole so as to be aligned with the through-hole.

10. A wafer polishing method using a wafer polishing apparatus including a lower surface plate, an upper surface plate, and a sensor unit configured to rotate together with the upper surface plate, the method comprising:
starting a double-side polishing process with respect to a wafer loaded on at least one carrier disposed on the lower surface plate and measuring a thickness of the wafer that is being polished using the sensor unit;
determining whether the thickness of the wafer that is being polished has reached a predetermined reference thickness;
upon determining that the thickness of the wafer that is being polished has reached the reference thickness, acquiring a shape information about a thickness profile of the wafer in a radial direction of the wafer at a predetermined period;

calculating a GBIR (Global Backside reference Indicate Reading) of the wafer using the acquired shape information about the thickness profile of the wafer in a radial direction of the wafer; and determining whether to stop a double-side polishing process with respect to the wafer based on the result of comparing a first GBIR of the wafer in a first period with a second GBIR of the wafer in a second period, wherein the first period and the second period are periods that are defined after a time point at which a thickness of the wafer that is being polished has reached the reference thickness, and the first period is a predetermined period that follows the second period.

11. The wafer polishing method according to claim 10, wherein the acquiring the shape information about the thickness profile of the wafer in the radial direction of the wafer includes:

measuring the thicknesses of the wafer that is being polished at a plurality of random thickness measurement points at the predetermined period; and acquiring the thickness profile of the wafer in the radial direction of the wafer based on the measured thicknesses of the wafer that is being polished.

12. The wafer polishing method according to claim 10, wherein the determining whether to stop the double-side polishing process with respect to the wafer includes:

when the first GBIR is equal to or exceeds the second GBIR, stopping the double-side polishing process with respect to the wafer.

13. The wafer polishing method according to claim 12, wherein, when the first GBIR does not exceed the second GBIR, shape information about the thickness profile of the wafer in the radial direction of the wafer is acquired at a next predetermined period, a GBIR of the wafer is calculated using the acquired shape information at the next predetermined period, and it is determined whether to stop the double-side polishing process with respect to the wafer based on the calculated GBIR.

14. The wafer polishing method according to claim 10, wherein each of the first and second periods is 30 seconds to 1 minute.

15. The wafer polishing method according to claim 10, wherein the shape information about the thickness profile of the wafer in the radial direction of the wafer is acquired based on coordinates of a movement path of a center of the carrier, coordinates of a movement path of a center of the wafer received in the carrier, and distances from the center of the wafer to points of the wafer at which the thicknesses are measured by the sensor unit.

16. A wafer polishing apparatus comprising:
a lower surface plate;
an upper surface plate disposed above the lower surface plate and configured to rotate;
a carrier disposed on the lower surface plate to receive a wafer;
a slurry supply unit disposed on the upper surface plate to supply slurry to the upper surface plate and configured to rotate together with the upper surface plate;
a sensor unit secured to the slurry supply unit for radiating light to the wafer received in the carrier, detecting light reflected by the wafer, and outputting detection data based on a detection result; and
a load-compensating unit secured to a region of the slurry supply unit that is opposite a region of the slurry supply unit to which the sensor unit is secured,
wherein the load-compensating unit has a same weight as the sensor unit, and
wherein the sensor unit rotates together with the upper surface plate.

* * * * *